(12) United States Patent
Tiengtum et al.

(10) Patent No.: US 8,704,542 B2
(45) Date of Patent: Apr. 22, 2014

(54) THERMAL CHAMBER FOR IC CHIP TESTING

(75) Inventors: Pongsak Tiengtum, Ladera Ranch, CA (US); Enrique Paz, Ladera Ranch, CA (US)

(73) Assignee: Titan Semiconductor Tool, LLC, Ladera Ranch, CA (US)

( * ) Notice: Subject to any disclaimer, the term of this patent is extended or adjusted under 35 U.S.C. 154(b) by 228 days.

(21) Appl. No.: 13/179,341

(22) Filed: Jul. 8, 2011

(65) Prior Publication Data

US 2013/0008628 A1 Jan. 10, 2013

(51) Int. Cl.
*F28F 27/02* (2006.01)

(52) U.S. Cl.
USPC ............ 324/750.03; 324/750.26; 324/750.28

(58) Field of Classification Search
CPC ....................................................... F28F 27/02
USPC .................. 324/324, 750.03–750.08, 754.08, 324/756.01–756.02, 762.01–762.03, 762.06
See application file for complete search history.

(56) References Cited

U.S. PATENT DOCUMENTS

| | | | |
|---|---|---|---|
| 5,977,785 A * | 11/1999 | Burward-Hoy | 324/750.09 |
| 5,986,459 A * | 11/1999 | Fukaya et al. | 324/756.02 |
| 6,213,636 B1 * | 4/2001 | Chien | 374/57 |
| 6,353,329 B1 * | 3/2002 | Kiffe | 324/756.02 |
| 7,425,838 B2 * | 9/2008 | Itakura et al. | 324/757.03 |
| 7,479,795 B2 * | 1/2009 | Hayashi et al. | 324/750.09 |
| 7,554,350 B2 * | 6/2009 | Suga et al. | 324/750.08 |
| 7,749,795 B2 * | 7/2010 | Tanaka | 438/57 |
| 8,395,400 B2 * | 3/2013 | Nakamura | 324/750.08 |
| 2002/0075023 A1 * | 6/2002 | Pierce | 324/758 |
| 2010/0243938 A1 * | 9/2010 | Sumiya et al. | 251/315.1 |

* cited by examiner

*Primary Examiner* — Arleen M Vazquez
*Assistant Examiner* — Robert P Alejnikov, Jr.
(74) *Attorney, Agent, or Firm* — Fulwider Patton LLP

(57) ABSTRACT

A thermal chamber and system for influencing the temperature of an IC chip under test including a thermal block that receives a chip socket, the thermal block adapted to be disposed between a docking interface plate and a workpress. The thermal block receives a flow of heated or cooled gas, and causes an IC chip to become heated or cooled prior to and during a test of the chip. The thermal chamber and system allows an IC chip to be testing under specific temperature conditions without using an expensive handler costing hundreds of thousands of dollars.

6 Claims, 7 Drawing Sheets

THERMAL CHAMBER FOR IC CHIP TESTING

BACKGROUND

The present invention is related generally to testing apparatus for integrated circuit chips ("IC chip" or "chip"), and more particularly to an assembly for regulating the temperature of an IC chip while the chip is mounted on a testing board so that it can be tested under predetermined temperature conditions.

Current IC chips can be designed to include hundreds of thousands of transistors, and those transistors require testing before the IC chip is delivered to a customer. Typically, each IC chip is incorporated into an integrated circuit module (IC module), and then the IC-chip in the IC-module is tested with a "burn-in" test, a "class" test, and a "system level" test. Electrical terminals are provided on the substrate which are connected by microscopic conductors in the substrate to the IC chip. The "burn-in" test thermally and electrically stresses the IC chips to accelerate "infant mortality" failures. The stressing causes immediate failures that otherwise would occur during the first ten percent of the chips' life in the field, thereby insuring a more reliable product for the customer. The burn-in test can take many hours to perform, and the temperature of the IC chip typically is held in the 90 degree C. to 140 degree C. range. Because the IC chips are also subjected to higher than normal voltages, the power dissipation in the IC chip can be significantly higher than in normal operation. This extra power dissipation makes the task of controlling the temperature of the IC chip very difficult. Further, in order to minimize the time required for burn-in, it is also desirable to keep the temperature of the IC chip as high as possible without damaging the IC chip.

The "class" test usually follows the burn-in test. Here, the IC chips are speed sorted and the basic function of each IC chip is verified. During this test, power dissipation in the IC chip can vary as the IC chip is sent a stream of test signals. Because the operation of an IC chip slows down as the temperature of the IC chip increases, very tight temperature control of the IC chip is required throughout the class test. This insures that the speed at which the IC chip operates is measured precisely at a specified temperature. If the IC-chip temperature is too high, the operation of the IC chip will get a slower speed rating, resulting in the IC-chip being sold as a lower priced part.

The "system level" test is the final test. In the system level test, the IC chips are exercised using software applications that are typical for a product that incorporates the IC chips. In the system level test, the IC chips are tested over a temperature range that can occur under normal operating conditions, i.e. approximately 20 degree −80 degree C.

During each of these tests, it is important to control and be able to test the chips under a variety of temperature ranges. Currently, to control the temperature of the chips during testing, large and expensive machines have been constructed such as those available from Delta Designs of Poway California, for example the ETC handlers (see www.deltad.com). These machines can cost up to four hundred thousand dollars or more. The temperature control of such machines requires larger volumes to be heated or cooled, and require large allocations of space and capital to operate. The present chip testing technology is in need of a low cost, efficient method of controlling the temperature of an IC chip under test.

SUMMARY OF THE INVENTION

The present invention is a small, lightweight cooling/heating chamber that can be used to test IC chips at a controlled temperature on a bench for device characterization and evaluation. This chamber can be retrofitted for use with existing test equipment and be incorporated into current test protocols without significant modification of the test equipment. The thermal chamber of the present invention is a block that has at least one inlet for a hot or cold fluid to circulate through a closed channel to heat or cool the chip, thereby reducing preheating/precooling, or "soak" time. There is also a second flow path that directly cools or heats the chip while testing. The cooling/heating chamber is designed to mate with a workpress (also referred to as a device nest or device plunger) and a docking interface plate to enclose the IC chip for testing purposes. The chamber can be designed with a ball valve or similar mechanism that controls the input of fluid into the chamber.

A clamp is also disclosed for use in securing the chip to the workpress, having a lever and pair of linkages that drive the workpress through the docking interface plate and against the chip/socket arrangement. The clamp includes spring mounted inside a block that connects to the workpress that yields a compliance for connecting to the chip. This compliance allows the downward force of the chip with the socket to be lessened, thereby reducing PCB wear and socket wear.

DETAILED DESCRIPTION OF THE PREFERRED EMBODIMENTS

The present invention is a thermal chamber that can be used to control the temperature of an IC chip under test. The temperature control uses a flow of fluid, which is preferably a cooled or heated gas such as air, nitrogen, or the like. The thermal chamber is designed to hold a chip socket, that itself contains an IC chip to be tested. The thermal chamber is mounted to a docking interface plate that includes a thermal insulator surrounding the thermal chamber. A work press engages a valve actuator on the thermal chamber to introduce fluid across the socket/chip surface.

Figure 1:
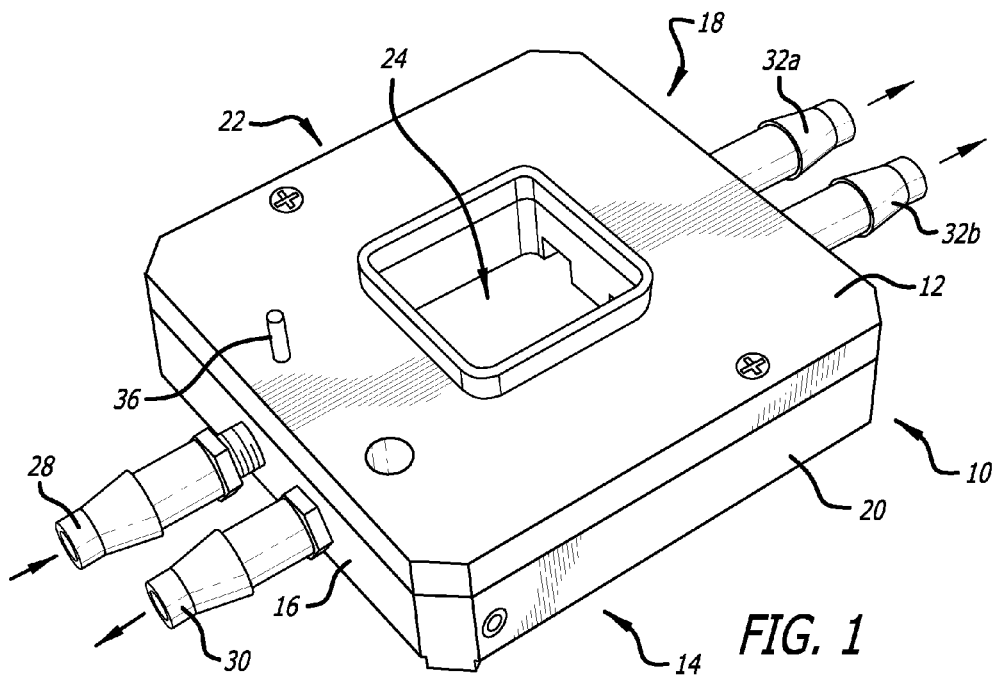
FIG. 1 is perspective view of a first embodiment of the chamber of the present invention.

FIG. 1 is a perspective view of the thermal block 10 that defines the thermal chamber. The thermal block 10 has a top side 12 and a bottom side 14, and front 16 and rear 18 walls along with first and second side walls 20,22. An aperture 24 in the interior of the block 10 allows a chip socket 26 to be inserted and held therein. The front wall 16 of the block 10 includes first and second nozzles 28, 30 that serve as ports for the introduction and exit of a fluid such as a heated or cooled gas. Nozzle 28 serves as the port for the temperature controlled fluid to enter the block 10, and nozzle 30 is the exhaust port where the temperature controlled fluid exits the block 10.

The rear wall 18 also includes two nozzles 32a,b that connect to two channels 33 that are fed from a opening 31 in the block at the aperture 24, the two channels 33 leading to the rear wall 18 and the nozzles 32a,b, and can channel the fluid out of the block 10 from the aperture 24. There are two fluid flow paths that are defined in the thermal block 10, a first channel 34 that internally extends around the block 10, entering at the first nozzle 28 and exiting through the second nozzle 30 on the front wall 16. A second path flows the fluid through the first nozzle 28 and into a first pathway (not shown) that leads to the aperture 24, where the fluid flows across the aperture 24, into the opening 31 and through the two channels 33 that lead out to the two nozzles 32a,b on the rear wall 18. A ball valve 36 is disposed on the first nozzle's 28 entrance to govern the flow of the fluid either through the first path or the second, as set forth more fully below.

Figure 2:
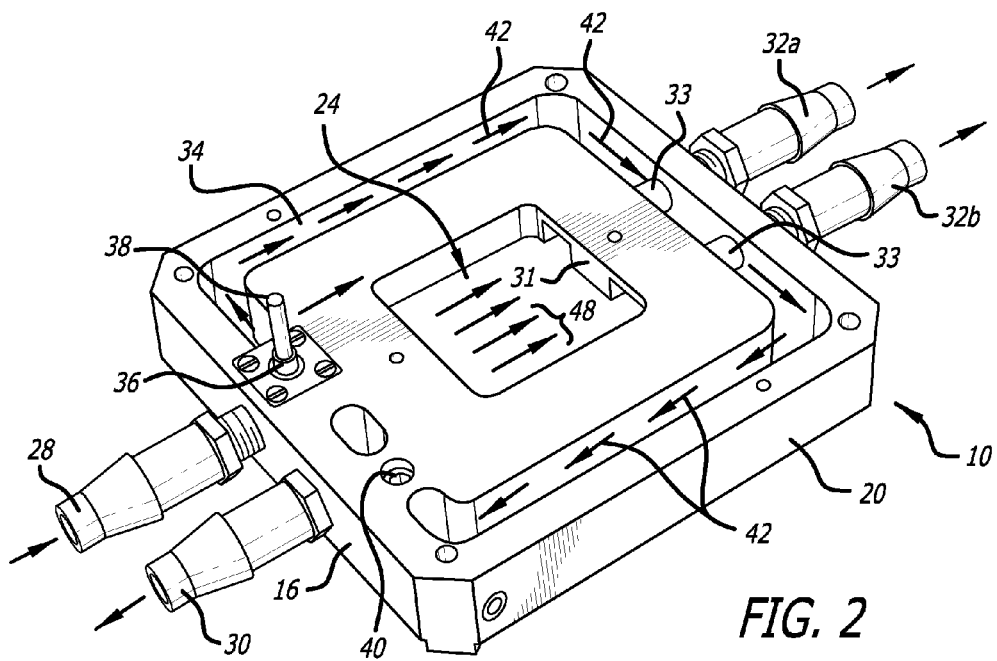
FIG. 2 is a cross-section of the chamber of FIG. 1.

FIG. 2 shows a cross-section of the block 10 illustrating the two paths of the fluid flow. When the ball valve 36 is in a first position, the flow of the fluid entering through the nozzle 28 is directed entirely through the channel 34, around the block 10, until the fluid exits the exhaust nozzle 30 after having completed a path around the entire block (depicted as arrows 42). The fluid flowing through the channel 34 will heat or cool the entire block, thereby shortening any pre-heating or pre-cooling, also referred to as "soak." A chip and socket disposed in the aperture 24 can be brought to the desired temperature during the soak period as the fluid circulates through the block 10.

During the actual testing, the ball valve can be moved to a second position by depressing the actuator 38, which blocks or partially blocks the flow path into the channel 34 while opening a flow path through the channel that leads to the aperture 24. With the socket and chip disposed in the aperture 24, the fluid can flow directly over the chip (depicted as arrows 48) to maintain even greater control on the temperature of the chip during the testing procedure. The relatively small mass of the chip will predominantly assume the temperature of the flowing gas over its surface during the test, ensuring a more accurate temperature response. The fluid flowing over the gas exits the aperture area through the opening 31 and through the channels 33 and out the nozzles 32a,b.

The gas or temperature controlled fluid can also be directed to flow in both paths by letting the ball valve occupy a position that blocks neither the channel 34 nor the path across the socket/chip. In some embodiments, this will be the mode for normal testing, with both flow paths employed. To control the amount of flow between the two flow paths, a flow control valve 40 may be located at the end of the channel 34 that controls the area of the exit exhaust nozzle. By reducing the area, more flow will be directed in the second flow path across the chip (indicated by arrows 48) and less flow will be directed around the channel 34 (indicated by arrows 42).

Figure 3:
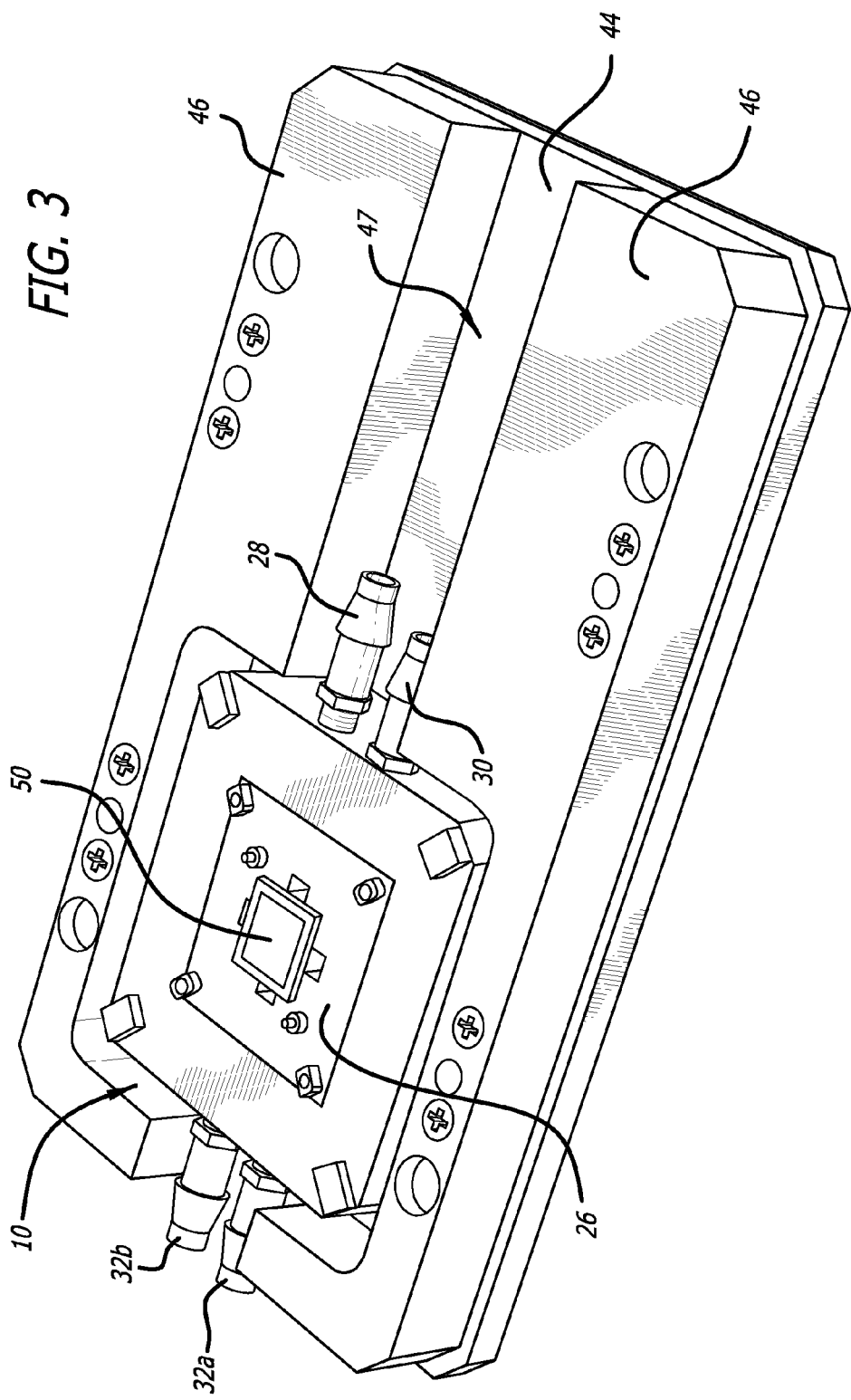
FIG. 3 is a view of the chamber of FIG. 1 mounted on a docking interface plate.
Figure 4:
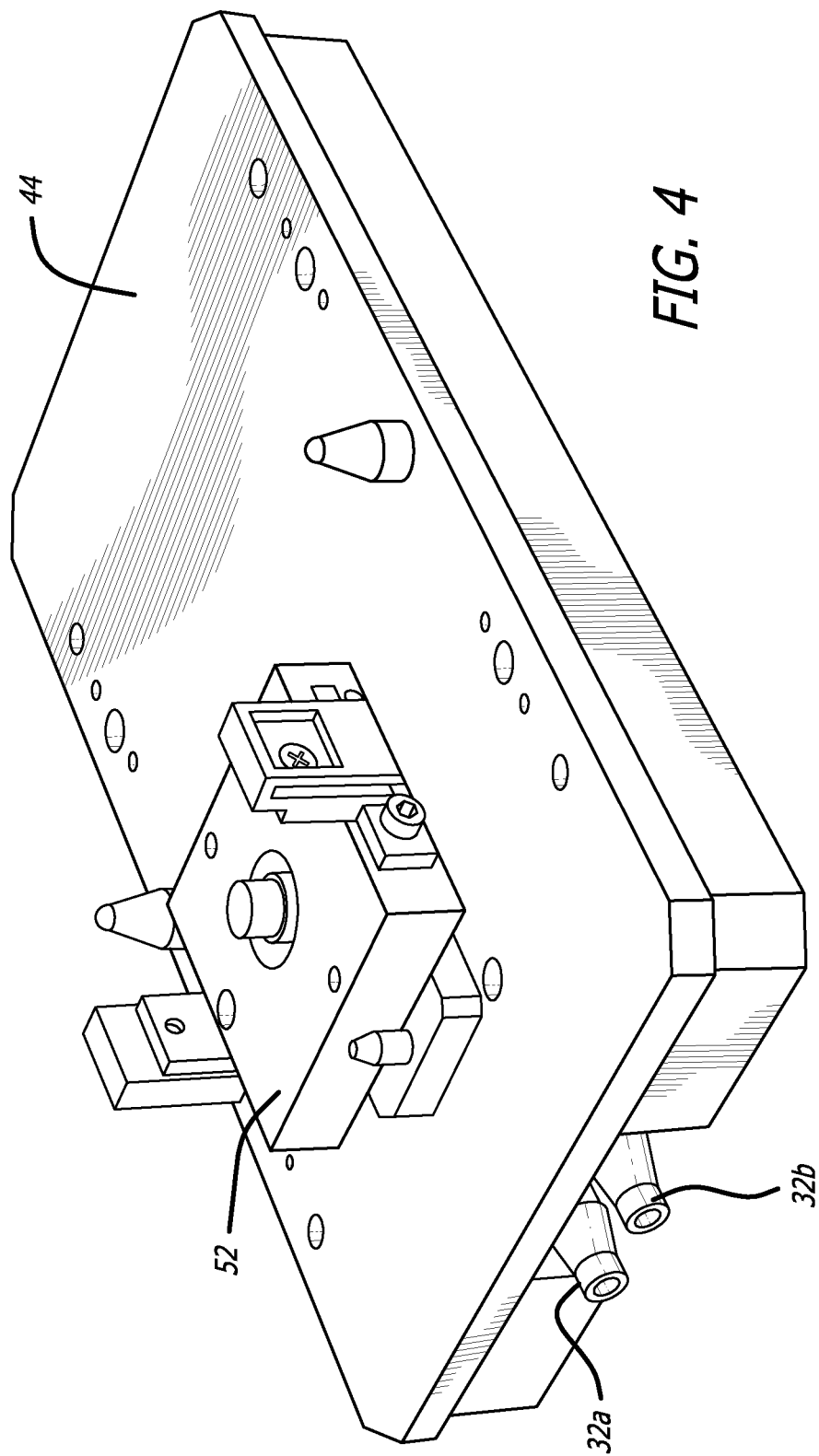
FIG. 4 is a reverse view of the docking interface plate of FIG. 3 showing the workpress.

FIGS. 3 and 4 illustrate how the thermal chamber can be incorporated into a testing set-up. In FIG. 3, a docking interface plate 44 has mounted on it a thermal insulating material 46 on a first surface to prevent heat loss or heat gain into the system during the testing. The insulating material has a depth that is approximate to the thickness of the block 10, and surrounds the block 10 while providing a pathway 47 for conduits that couple to the nozzles 28, 30 to extend therefrom. Inside the block 10 is a socket 26 that mounts in the aperture 24, and an IC chip 50 is mounted in the socket 26. With the socket 26 and chip 50 in the block 10, heating or cooling fluid such as air can be passed directly over the face of the chip while it is being tested, thereby providing an efficient method of testing the chip under a variety of different temperature conditions without using large, expensive equipment for this purpose.

FIG. 4 illustrates the reverse view of FIG. 3, showing the underside of the docking interface plate 44 with the nozzles 32a,b, exposed. A workpress 52 is mounted to the underside of the docking interface plate 44, as is well known in the industry. As FIG. 4 illustrates, the thermal chamber is incorporated directly into the workpress/docking interface plate assembly without inhibiting the testing function of the chip or the testing set-up. Hot or cold air, nitrogen, or other gas can be introduced through nozzle 28 and allowed to flow over the chip 50 while the chip is being tested, and while the block 10 is temperature controlled by the same fluid.

The workpress, which can be for example a TCWP Titan Compliant workpress, can be installed in a handler or other automation equipment. The workpress picks up the chip from a tray and delivers it to the socket and thermal chamber assembly. The socket/thermal chamber may then be installed on a printed circuit board (PCB) fixture, which is mounted on a tester equipment or plugged into testing equipment. In the present set-up, the chip is seated in the socket and engaged for electrical testing before the ball valve is fully depressed for full airflow. An important feature is that the airflow will not blow the chip off of the workpress as it is being presented to the socket. That is, as the chip is being removed from the socket, the ball valve closes the airflow, preventing airflow from separating the chip from the workpress. This is important because, if the chip falls off the workpress vacuum, the machine stops and an operator must remove the chip and reset the machine, causing downtime. This feature is unique to the present set-up.

Figure 5:
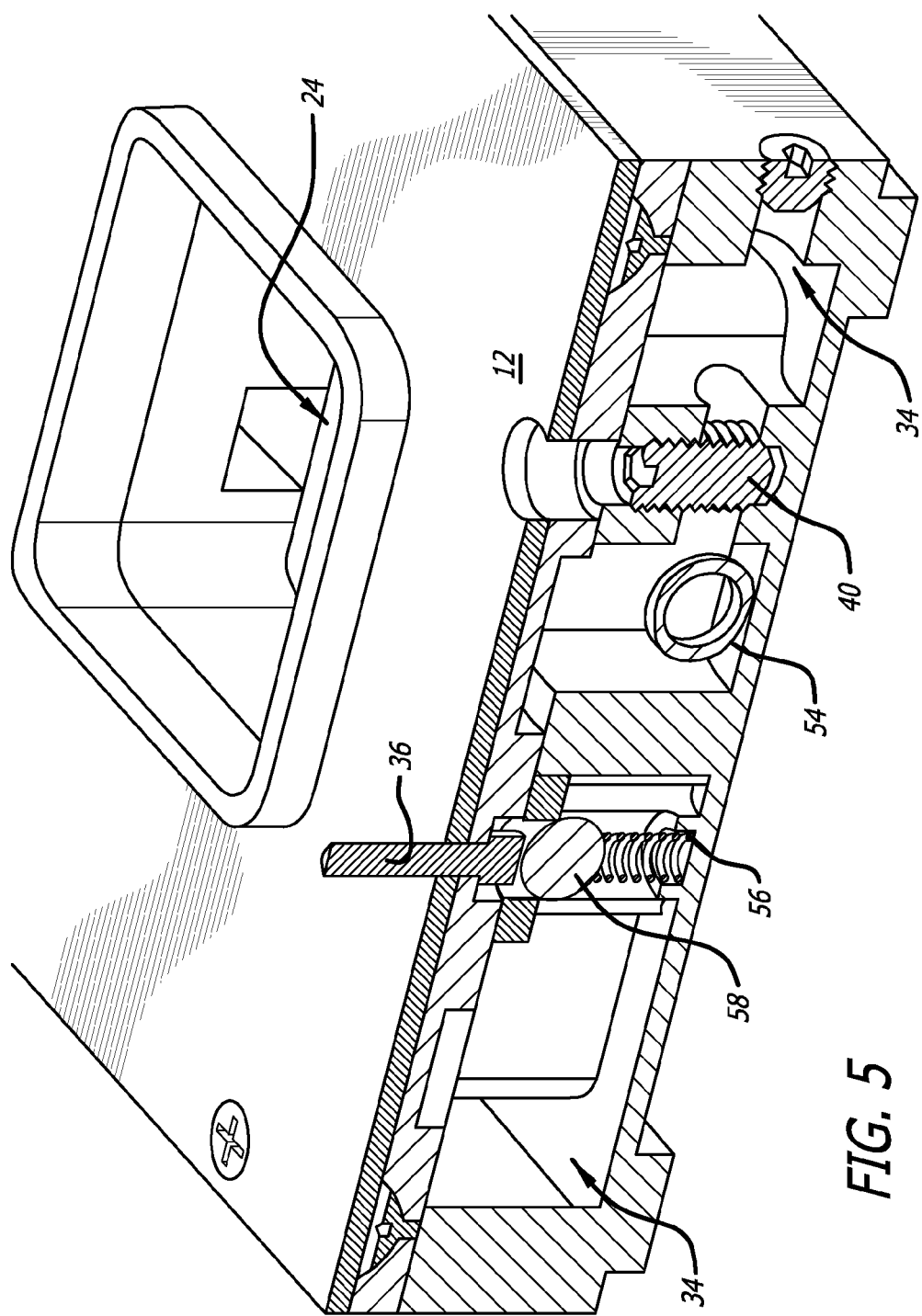
FIG. 5 is a cross-sectional view of the chamber showing the ball valve.

FIG. 5 illustrates the ball valve 36 at the entrance to the channel 34, and also the flow control valve 40 at the exit of the channel 34. The flow control valve can be a screw member 40 that blocks or partially blocks the exit 54 of the channel 34, such that rotation of the screw member 40 in a first direction entirely blocks the exit, forcing the fluid to flow entirely through the second path 48 across the block. Conversely, rotation of the control valve 40 in the opposite direction opens the path out of the channel 34 through exit 54 (which leads to nozzle 30), such that more of the fluid will follow the first path through channel 34 since there is less resistance along this path. The ball valve 36 includes an occluding member 58 that blocks the path across the aperture 24 in the unbiased condition due to the force of the spring member 56. However, when the pin 38 is depressed, the occluding member 58 compresses the spring as it lowers, exposing a channel through the block leading to the aperture 24 and across the block 10.

Figure 6:
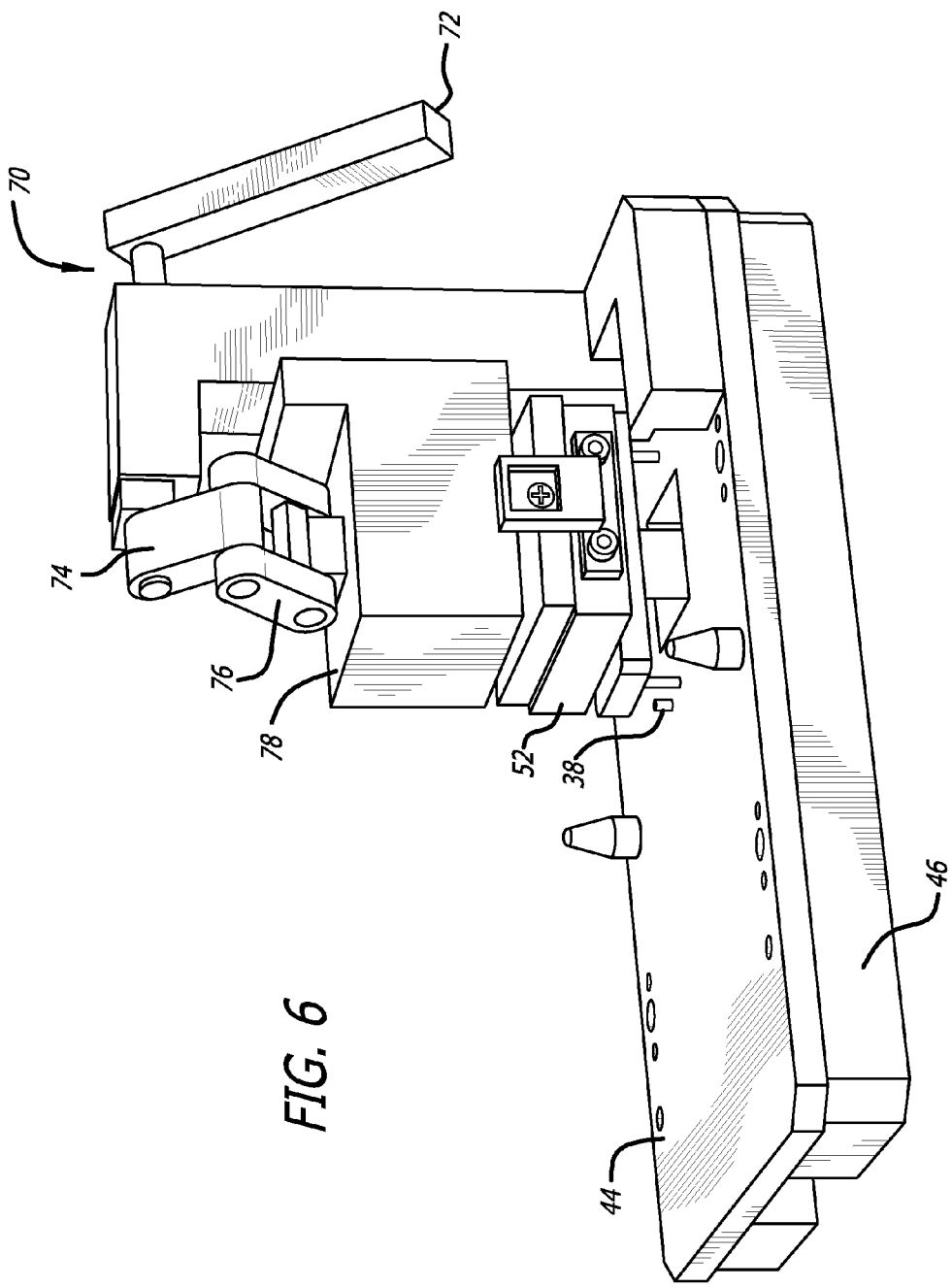
FIG. 6 is a view perspective view of a clamp for use with the thermal chamber in testing an IC chip.
Figure 7:
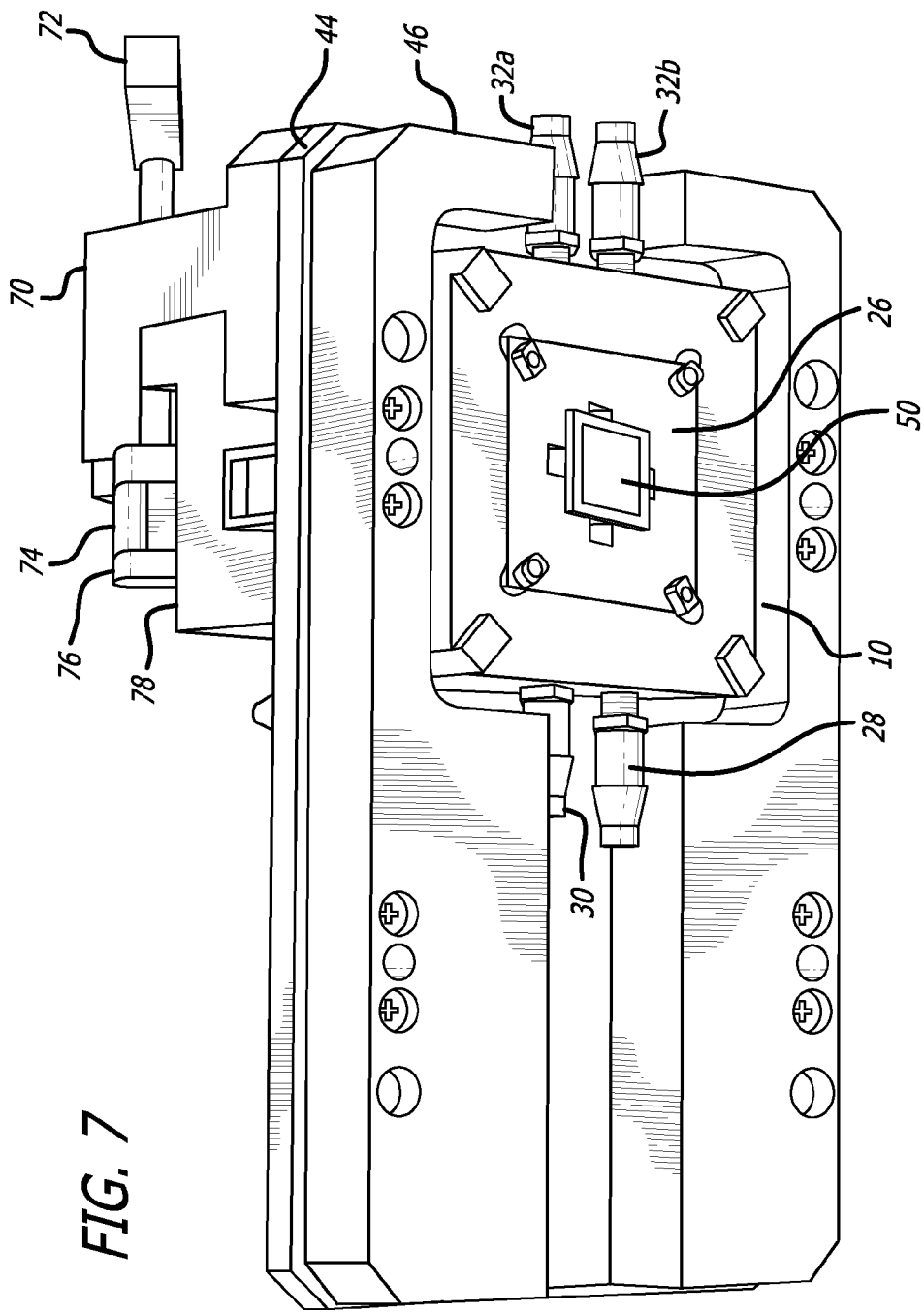
FIG. 7 is another perspective view of the clamp of FIG. 6 showing the thermal chamber and IC chip mounted thereto.
Figure 8:
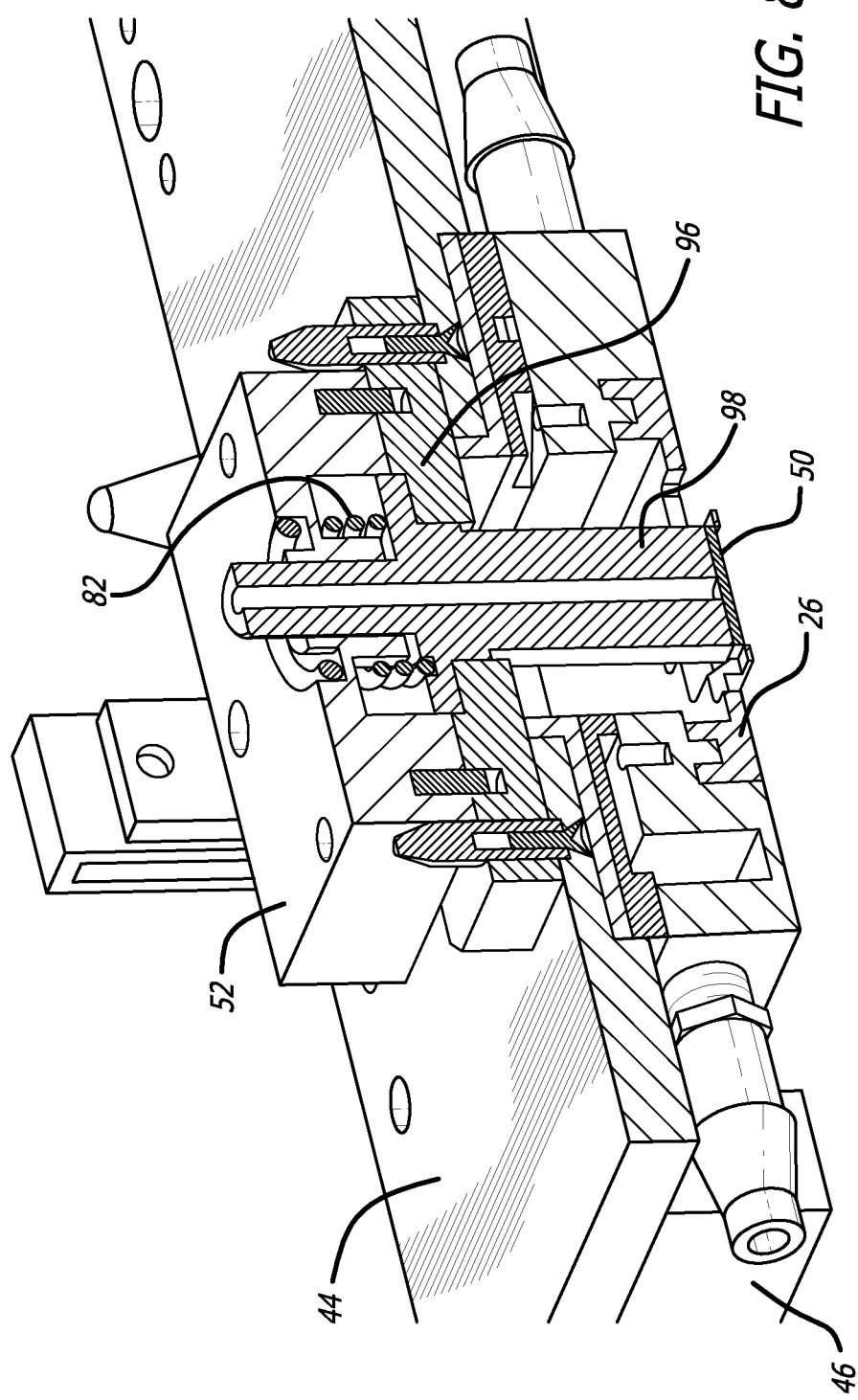
FIG. 8 is a perspective view, partially cut away, of the clamp assembly and the cooling chamber.

FIGS. 6-8 illustrate a clamp 70 that may be used in conjunction with the thermal chamber in a manual mode. The clamp 70 works with the workpress 52 to allow for manual operation without using a large automated handler or other expensive equipment. The clamp 70 mounts on the docking interface plate 44 as shown in FIG. 6. The clamp 70 has a manual lever 72 that pivots to open and close a pair of linkages 74, 76 in a scissor motion, which in turn drives a base 78 that secures the workpress 52. The workpress 52 moves vertically down through the hole in the docking interface plate 44 and against the socket 26 and chip 50, secured on the underside of the docking interface plate 44. The lower surface of the workpress 52 depresses the ball valve actuator 38 to direct the flow across the chip 50 as discussed above, and when the lever 72 is rotated back, the workpress 52 disengages the docking interface plate 44 and the ball valve actuator 38 springs back to the original position.

Traditional workpresses have no compliance or spring; rather, the traditional workpress includes a plunger gap of approximately one millimeter and then bottoms out. The lower portion of the workpress, (referred to sometimes as a "bladepak"), pushes directly on the chip mounted in the workpress. FIG. 8 illustrates a new workpress 52 that has compliance due to an internal spring 82 that allows resilient pressure on the chip 50. The workpress 52 is mounted to the base 78 at a lower platform. A plunger 98 is coupled to the spring 82, decoupling the plunger's vertical motion from the cover of the workpress. The spring may have a force of between seven and twenty seven pounds in a preferred embodiment, although the spring may be chosen to meet the needs of the particular application. The compliance can be in the range of about one millimeter, depending upon the selected spring and the tolerances desired, which provides for a chip thickness variation of up to 0.5 mm. The lower platform preferably rides on guides that allow the workpress to slide vertically, but allow some play in the vertical position to prevent damage to the chip.

The spring provides some tolerance with respect to the force of the workpress, which helps to prevent wear on the PCB and the socket by reducing the force on the socket and load boards. The compliance also has an important feature with respect to the thermal chamber. As a chip 50 is seated in the socket 26 and engaged for electrical testing before the workpress 52 engages the ball valve actuator 38, air will be flowing around the block 10 but not across the chip 50. It is important that the airflow does flow across the chip until the workpress is fully seated against the socket. Otherwise, the airflow can blow the chip 50 off of the workpress 52 as it is being presented to the socket 26. As a result of the compliance in the clamp 70, as the chip 50 is being removed from the socket 26, the ball valve 36 closes the airflow, preventing blowoff.

The cooling/heating block 10 can take other configurations and the illustrated embodiment is meant to be exemplary only. For example, the number and placement of the nozzles can vary depending upon the requirements of the system without departing from the spirit of the invention. Similarly, the shape of the block is not critical and can take other shapes that make it convenient for the workpress and docking interface plate if necessary. Therefore, the preceding descriptions and embodiments should not be interpreted to limit the invention in any manner other than where expressly stated herein, and that the invention's scope should properly be interpreted based on the appended claims, in view of the foregoing but wherein the words of the claims are given their ordinary meaning.

We claim:

1. A device for controlling a temperature of an integrated circuit chip under test, comprising:
    a thermal block having a top wall, a left wall, a right wall, and front wall, and a rear wall, the front wall having a first port for introducing a temperature controlled fluid into the thermal block and a second port for the temperature controlled fluid to exit the thermal block;
    a centrally disposed aperture in the thermal block forming an enclosure for capturing an IC chip socket;
    a first fluid channel defining a path around the centrally disposed aperture;
    a second fluid channel extending across the centrally disposed aperture; and
    a fluid control mechanism for selectively diverting fluid through said first and second fluid channels.

2. The device of claim 1 wherein the fluid control mechanism is a ball valve.

3. The device of claim 2 wherein the ball valve has a pin protruding through the top wall of the thermal block to actuate the ball valve.

4. The device of claim 1 wherein the thermal block is substantially rectangular and the aperture is substantially rectangular.

5. The device of claim 1 wherein the first port includes a nozzle for introducing the thermally controlled fluid through the first port.

6. The device of claim 1 further comprising an exhaust control valve for controlling the fluid exiting the first fluid channel.

* * * * *